(12) United States Patent
Yin et al.

(10) Patent No.: US 11,829,176 B2
(45) Date of Patent: Nov. 28, 2023

(54) SWITCH CURRENT SOURCE CIRCUIT AND METHOD FOR QUICKLY ESTABLISHING SWITCH CURRENT SOURCE

(71) Applicant: MONTAGE TECHNOLOGY (KUNSHAN) CO., LTD., Jiangsu (CN)

(72) Inventors: Jian Yin, Jiangsu (CN); Lixin Jiang, Jiangsu (CN); Hui Yu, Jiangsu (CN)

(73) Assignee: Montage Technology (Kunshan) Co., Ltd., Jiangsu (CN)

( * ) Notice: Subject to any disclaimer, the term of this patent is extended or adjusted under 35 U.S.C. 154(b) by 0 days.

(21) Appl. No.: 16/978,773

(22) PCT Filed: May 12, 2020

(86) PCT No.: PCT/CN2020/089726
§ 371 (c)(1),
(2) Date: Sep. 8, 2020

(87) PCT Pub. No.: WO2021/203513
PCT Pub. Date: Oct. 14, 2021

(65) Prior Publication Data
US 2023/0094422 A1 Mar. 30, 2023

(30) Foreign Application Priority Data
Apr. 8, 2020 (CN) .......................... 202010270340.1

(51) Int. Cl.
*G05F 3/02* (2006.01)
*H02M 3/156* (2006.01)
*H03K 17/30* (2006.01)

(52) U.S. Cl.
CPC ............ *G05F 3/02* (2013.01); *H02M 3/1563* (2013.01); *H03K 17/302* (2013.01)

(58) Field of Classification Search
CPC ....... H02M 3/1563; G05F 3/02; H03K 17/302
See application file for complete search history.

(56) References Cited

U.S. PATENT DOCUMENTS

| | | | | | |
|---|---|---|---|---|---|
| 5,052,022 A | * | 9/1991 | Nishita | .................. | H04L 25/247 375/376 |
| 5,497,120 A | * | 3/1996 | Ito | .................... | G01R 19/16519 330/261 |
| 5,675,278 A | * | 10/1997 | Tanaka | ............. | H03K 3/356113 327/333 |

(Continued)

*Primary Examiner* — Yusef A Ahmed

(57) ABSTRACT

The present disclosure provides a switching current source circuit and a method for quickly establishing a switching current source. The switching current source circuit includes a first and a second switching current source branches connected in parallel with one end of a load. When the switching enable signal is switched, due to the charge coupling of the first and second switching current source branches, the bias voltage respectively generates bounce in the same direction as and a direction opposite to the transition direction of the switching enable signal. The two bounces cancel each other to make the current source bias voltage recover quickly when a toggle event happens. The present disclosure accelerates the establishment of current through the coupling of charges, and reduces the decoupling capacitance at the same time, thereby reducing the circuit area and saving the costs.

10 Claims, 7 Drawing Sheets

(56) References Cited

U.S. PATENT DOCUMENTS

| | | | | |
|---|---|---|---|---|
| 5,936,392 A * | 8/1999 | Taylor | G05F 3/267 | |
| | | | 327/543 | |
| 5,940,322 A * | 8/1999 | Atsumi | G05F 3/262 | |
| | | | 365/189.09 | |
| 7,602,169 B1 * | 10/2009 | Schofield | H03H 11/38 | |
| | | | 324/110 | |
| 7,683,720 B1 * | 3/2010 | Yehui | H03F 1/483 | |
| | | | 30/304 | |
| 8,514,006 B2 * | 8/2013 | Cooney | H03K 19/01714 | |
| | | | 327/108 | |
| 10,310,528 B1 * | 6/2019 | Elsayed | G05F 3/30 | |
| 10,642,303 B1 * | 5/2020 | Pauk | G05F 1/56 | |
| 11,050,424 B1 * | 6/2021 | Nagarajan | H03K 19/018521 | |
| 11,152,902 B2 * | 10/2021 | Yasuda | G11C 7/1078 | |
| 11,658,625 B2 * | 5/2023 | Modaffari | H03K 5/24 | |
| | | | 330/252 | |
| 2001/0052818 A1 * | 12/2001 | Suzuki | H03F 3/45708 | |
| | | | 330/253 | |
| 2002/0009013 A1 * | 1/2002 | Lee | G11C 5/14 | |
| | | | 365/230.06 | |
| 2004/0090254 A1 * | 5/2004 | Owens | H03K 5/13 | |
| | | | 327/170 | |
| 2004/0257150 A1 * | 12/2004 | Farooqui | G05F 3/30 | |
| | | | 327/539 | |
| 2005/0046406 A1 * | 3/2005 | Menegoli | G05F 3/222 | |
| | | | 323/313 | |
| 2005/0110525 A1 * | 5/2005 | Chen | H03K 19/09432 | |
| | | | 326/115 | |
| 2006/0158158 A1 * | 7/2006 | Eberlein | H02M 3/156 | |
| | | | 324/609 | |
| 2007/0229166 A1 * | 10/2007 | Shor | G05F 3/262 | |
| | | | 330/288 | |
| 2011/0304399 A1 * | 12/2011 | Kikuchi | H04L 25/0282 | |
| | | | 330/296 | |
| 2011/0316629 A1 * | 12/2011 | Zhang | H03F 3/45968 | |
| | | | 330/253 | |
| 2016/0315604 A1 * | 10/2016 | Zhan | H03K 5/2481 | |
| 2016/0380786 A1 * | 12/2016 | Goyal | H04L 25/03146 | |
| | | | 375/233 | |
| 2018/0144707 A1 * | 5/2018 | Tsuchi | H03F 3/4521 | |
| 2020/0204171 A1 * | 6/2020 | Stoerk | H03K 17/08142 | |
| 2021/0329179 A1 * | 10/2021 | Kim | H04N 25/60 | |
| 2022/0014196 A1 * | 1/2022 | Liang | H03K 19/018528 | |

\* cited by examiner

SWITCH CURRENT SOURCE CIRCUIT AND METHOD FOR QUICKLY ESTABLISHING SWITCH CURRENT SOURCE

CROSS REFERENCE TO RELATED APPLICATION

This is a Sect. 371 National Stage of PCT International Application No. PCT/CN2020/089726, filed on 12 May 2020, which claims priority of a Chinese Patent Application No. 2020102703401 filed on 8 Apr. 2020, the contents of which are incorporated herein by reference in its entirety.

BACKGROUND

Field of Disclosure

The present disclosure relates to the field of analog integrated circuits, in particular, to a switching current source circuit and a method for quickly establishing a switching current source.

Description of Related Arts

With the continuous development of integration and performance of integrated circuits, today's integrated circuits have reached the level of 100 watts, which requires expensive packaging, heat sinks and cooling environments. According to Moore's Law, the density of transistors doubles every 18 months. However, it takes five years for power technology to achieve the same growth rate. The power technology has become a bottleneck. Large current in circuits will reduce the life and reliability of products and will cause failure when the dynamic voltage drop of power supply is serious. Therefore, it is necessary to reduce the power consumption of integrated circuit. Usually, bias current is reduced to save power consumption.

One way to reduce power consumption is to cut off bias voltage path and pull the bias voltage to ground (for NMOS transistors) or power supply (for PMOS transistors) to disable a current source, thereby reducing the power consumption. As shown in FIG. 1, an analog load 11, a first transistor Q1 and a second transistor Q2 are sequentially connected in series. A gate of the first transistor Q1 is connected with a preset voltage Vb_cas (the first transistor Q1 serves as a cascode transistor and is configured to increase an internal resistance of the current source). A gate of the second transistor Q2 receives a bias voltage Vb through a first switch S1, and the bias voltage Vb is output from the current mirror Q3. A gate of the second transistor Q2 is grounded through a second switch S2. An enable signal En_b of the second switch S2 is opposite to an enable signal En of the first switch S1, one of the second switch S2 and the first switch S1 is selected to be turned on, and the second transistor Q2 is used as a current source. A decoupling capacitor C is connected between the gate of the transistor Q2 and the ground. When the current source operates normally, the first switch S1 is turned on, and a bias current corresponding to the bias voltage Vb is generated at a drain of the second transistor Q2. When the current source is disabled, the second switch S2 is turned on, the gate of the second transistor Q2 is pulled down to ground, and the current source is disabled. In this process, due to the larger capacitance value of the decoupling capacitor C and the weaker bias current at the input end of the current mirror Q3, the gate control current source requires a long setting time, and the time constant is approximately C/gm_dio (C is a capacitance value of the decoupling capacitor, gm_dio is a transconductance of the current mirror Q3). At the same time, because the first switch S1 itself may generate a certain voltage drop, the gate voltage of the second transistor Q2 is less than the bias voltage Vb, resulting in a deviation (systematic error) between the actual current source and a preset value.

Another way is to set a switching device in the current source circuit to achieve the purpose of disabling the current source and reducing power consumption. The switching device can be set between the analog load and the current source, or between the current source and ground (power supply for PMOS). However, when an enable signal of the switching device is switched, the bias voltage will have a voltage bounce accordingly. As a result, the bias current cannot be established quickly, and a large decoupling capacitor needs to be added to suppress the current fluctuation.

Therefore, how to use a switching current source to reduce power consumption while ensuring the establishment speed of the switching current source and reducing the die size cost or silicon size cost has become one of the problems to be urgently solved by those skilled in the art.

SUMMARY

The present disclosure provides a switching current source circuit and a method for quickly establishing switching current source, to solve the problem of poor performance of the switching current source when reducing the bias current in the prior art.

The present disclosure provides a switching current source circuit, which at least includes: a first switching current source branch and a second switching current source branch connected in parallel with an end of a load and configured to regulate a current flowing through the load; when a switching enable signal transitions, a bias node in the first switching current source branch generates positive bounce in the same direction as a transition direction of the switching enable signal, a bias node in the second switching current source branch generates negative bounce in a direction opposite to the transition direction of the switching enable signal, the positive bounce and the negative bounce cancel each other out, so that the current flowing through the load is quickly established when a toggle event happens.

Optionally, the first switching current source branch includes a first NMOS transistor, a second NMOS transistor, and a third NMOS transistor; a drain of the first NMOS transistor is connected with the load, a gate of the first NMOS transistor is connected with the switching enable signal, and a source of the first NMOS transistor is connected with a drain of the second NMOS transistor; a gate of the second NMOS transistor is connected with a bias voltage, and a source of the second NMOS transistor is connected with a drain of the third NMOS transistor; a gate of the third NMOS transistor is connected with a high voltage, and a source of the third NMOS transistor is grounded.

The second switching current source branch includes a fourth NMOS transistor, a fifth NMOS transistor, and a sixth NMOS transistor; a drain of the fourth NMOS transistor is connected with the load, a gate of the fourth NMOS transistor is connected with a high voltage, and a source of the fourth NMOS transistor is connected with a drain of the fifth NMOS transistor; a gate of the fifth NMOS transistor is connected with the bias voltage, and a source of the fifth NMOS transistor is connected with a drain of the sixth NMOS transistor; and a gate of the sixth NMOS transistor is connected with the switching enable signal, and a source of the sixth NMOS transistor is grounded.

More optionally, the switching current source circuit further includes a seventh NMOS transistor; a drain of the seventh NMOS transistor is connected with the load, a gate of the seventh NMOS transistor is connected with a preset voltage, and a source of the seventh NMOS transistor is connected with the drains of the first NMOS transistor and the fourth NMOS transistor.

More optionally, the switching current source circuit further includes a first current source; one end of the first current source is connected with the drains of the first NMOS transistor and the fourth NMOS transistor, and the other end of the first current source is grounded.

Optionally, the first switching current source branch includes a first PMOS transistor, a second PMOS transistor and a third PMOS transistor; a drain of the first PMOS transistor is connected with the load, a gate of the first PMOS transistor is connected with a low voltage, and a source of the first PMOS transistor is connected with a drain of the second PMOS transistor; a gate of the second PMOS transistor is connected with the bias voltage, and a source of the second PMOS transistor is connected with a drain of the third PMOS transistor; a gate of the third PMOS transistor is connected with the switching enable signal, and a source of the third PMOS transistor is connected with a power supply.

The second switching current source branch includes a fourth PMOS transistor, a fifth PMOS transistor and a sixth PMOS transistor; a drain of the fourth PMOS transistor is connected with the load, a gate of the fourth PMOS transistor is connected with the switching enable signal, and a source of the fourth PMOS transistor is connected with a drain of the fifth PMOS transistor; a gate of the fifth PMOS transistor is connected with the bias voltage, and a source of the fifth PMOS transistor is connected with a drain of the sixth PMOS transistor; and a gate of the sixth PMOS transistor is connected with a low voltage, and a source of the sixth PMOS transistor is connected with the power supply.

More optionally, the switching current source circuit further includes a seventh PMOS transistor; a drain of the seventh PMOS transistor is connected with the load, a gate of the seventh PMOS transistor is connected with a preset voltage, and a source of the seventh PMOS transistor is connected with the drains of the first PMOS transistor and the fourth PMOS transistor.

More optionally, the switching current source circuit further includes a second current source; one end of the second current source is connected with the drains of the first PMOS transistor and the fourth PMOS transistor, and the other end of the second current source is connected with the power supply.

The present disclosure further provides a switching current source circuit, which at least includes: a switching current source branch connected with an end of a load and configured to regulate a current flowing through the load. When a switching enable signal transitions, a first bias node in the switching current source branch generates positive bounce in the same direction as a transition direction of the switching enable signal, a second bias node in the switching current source branch generates negative bounce in a direction opposite to the transition direction of the switching enable signal, the positive bounce and the negative bounce cancel each other out, so that the current flowing through the load is quickly established when a toggle event happens.

Optionally, the switching current source branch includes an eighth NMOS transistor, a ninth NMOS transistor, and a tenth NMOS transistor; a drain of the eighth NMOS transistor is connected with the load, a gate of the eighth NMOS transistor is connected with the switching enable signal, and a source of the eighth NMOS transistor is connected with a drain of the ninth NMOS transistor; a gate of the ninth NMOS transistor is connected with a bias voltage, and a source of the ninth NMOS transistor is connected with a drain of the tenth NMOS transistor; and a gate of the tenth NMOS transistor is connected with the switching enable signal, and a source of the tenth NMOS transistor is grounded.

More optionally, the switching current source circuit further includes an eleventh NMOS transistor; a drain of the eleventh NMOS transistor is connected with the load, a gate of the eleventh NMOS transistor is connected with a preset voltage, and a source of the eleventh NMOS transistor is connected with the drain of the eighth NMOS transistor.

More optionally, the switching current source circuit further includes a third current source; one end of the third current source is connected with the drain of the eighth NMOS transistor, and the other end of the third current source is grounded.

Optionally, the switching current source branch includes an eighth PMOS transistor, a ninth PMOS transistor, and a tenth PMOS transistor; a drain of the eighth PMOS transistor is connected with the load, a gate of the eighth PMOS transistor is connected with the switching enable signal, and a source of the eighth PMOS transistor is connected with a drain of the ninth PMOS transistor; a gate of the ninth PMOS transistor is connected with a bias voltage, and a source of the ninth PMOS transistor is connected with a drain of the tenth PMOS transistor; and a gate of the tenth PMOS transistor is connected with the switching enable signal, and a source of the tenth PMOS transistor is grounded.

More optionally, the switching current source circuit further includes an eleventh PMOS transistor; a drain of the eleventh PMOS transistor is connected with the load, a gate of the eleventh PMOS transistor is connected with a preset voltage, and a source of the eleventh PMOS transistor is connected with the drain of the eighth PMOS transistor.

More optionally, the switching current source circuit further includes a fourth current source; one end of the fourth current source is connected with the drain of the eighth PMOS transistor, and the other end of the fourth current source is grounded.

The present disclosure further provides a method for quickly establishing a switching current source. The switching current source includes one or two switching current source branches and two bias nodes, the method at least includes: generating, by the two bias nodes respectively, positive bounce in the same direction as a transition direction of the switching enable signal and negative bounce in a direction opposite to the transition direction of the switching enable signal when a switching enable signal transitions, cancelling the positive bounce with the negative bounce, so that a current flowing through the load is quickly established when a toggle event happens.

Optionally, the two bias nodes are respectively placed in two parallel switching current source branches to regulate a current ratio between the two switching current source branches to balance charges.

Optionally, two bias nodes are placed in series in the same switching current source branch.

As described above, the switching current source circuit and the method for quickly establishing the switching current source of the present disclosure have the following beneficial effects:

The switching current source circuit and the method for quickly establishing the switching current source of the present disclosure accelerate the establishment of current through the coupling of charges, and reduce the decoupling capacitance at the same time, thereby reducing the circuit area and saving the costs.

DESCRIPTION OF REFERENCE NUMERALS

11 Analog load
2 Switching current source circuit
21 Load
22 First switching current source branch
23 Second switching current source branch
24 Switching current source branch

DETAILED DESCRIPTION OF THE PREFERRED EMBODIMENTS

The embodiments of the present disclosure will be described below through exemplary embodiments. Those skilled in the art can easily understand other advantages and effects of the present disclosure according to contents disclosed by the specification. The present disclosure can also be implemented or applied through other different exemplary embodiments. Various modifications or changes can also be made to all details in the specification based on different points of view and applications without departing from the spirit of the present disclosure.

It needs to be stated that the drawings provided in the following embodiments are just used for schematically describing the basic concept of the present disclosure, thus only illustrating components only related to the present disclosure and are not drawn according to the numbers, shapes and sizes of components during actual implementation, the configuration, number and scale of each component during actual implementation thereof may be freely changed, and the component layout configuration thereof may be more complicated.

The present disclosure provides a switching current source circuit to overcome the current source fluctuation and reduce current settling time by the enable signal transition of the switch.

Figure 1:
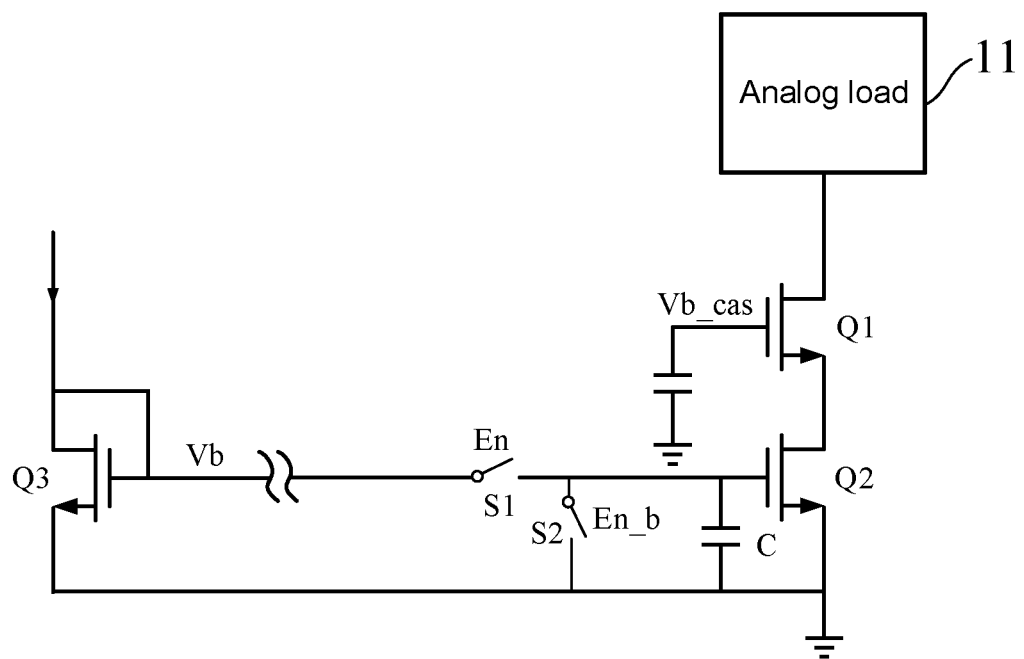
FIG. 1 shows a schematic view of a current source circuit in the prior art.
Figure 2:
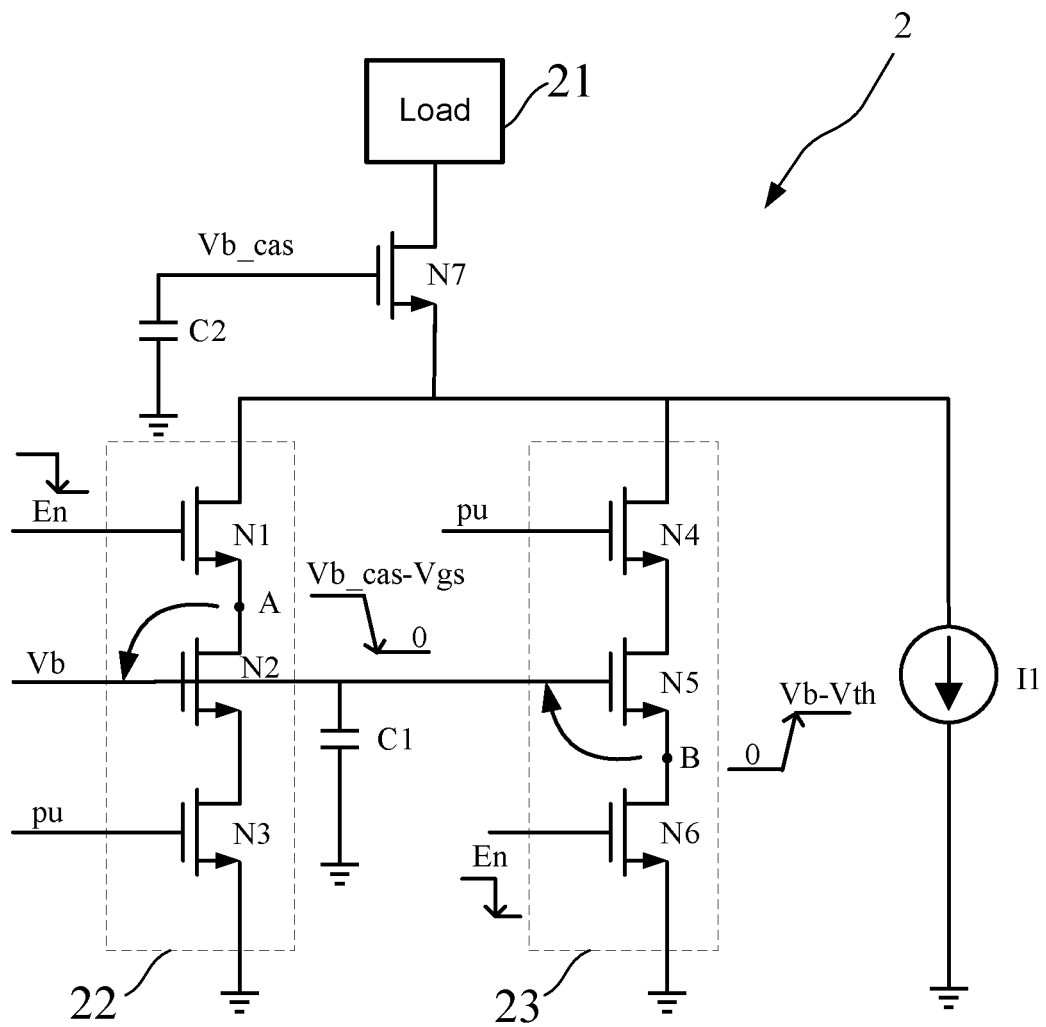
FIGS. 2 and 3 show schematic views of a switching current source circuit according to an embodiment of the present disclosure, respectively.
Figure 3:
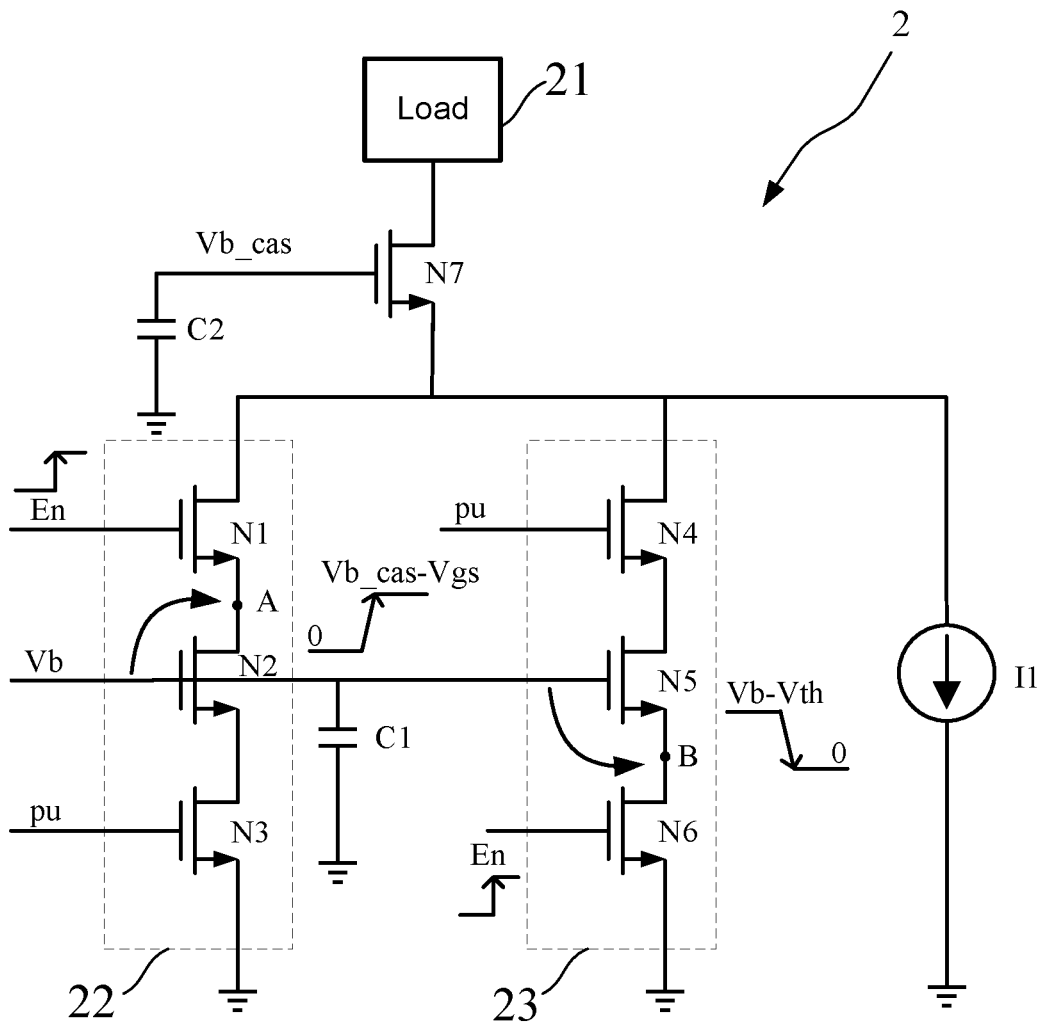

FIGS. 2 and 3 show schematic views of a switching current source circuit according to an embodiment of the present disclosure. The switching current source circuit 2 includes: a first switching current source branch 22 and a second switching current source branch 23 connected in parallel with one end of a load 21, for regulating current flowing through the load 21.

As shown in FIGS. 2 and 3, when a switching enable signal En transitions, a bias node A in the first switching current source branch 22 generates positive bounce in a same direction as a transition direction of the switching enable signal En.

Specifically, in this embodiment, the first switching current source branch 22 includes a first NMOS transistor N1, a second NMOS transistor N2, and a third NMOS transistor N3. A drain of the first NMOS transistor N1 is connected with the load 21, a gate of the first NMOS transistor N1 is connected with the switching enable signal En, and a source of the first NMOS transistor N1 is connected with a drain of the second NMOS transistor N2. The first NMOS transistor N1 serves as a switch. A gate of the second NMOS transistor N2 is connected with a bias voltage Vb, and a source of the second NMOS transistor N2 is connected with a drain of the third NMOS transistor N3. The second NMOS transistor N2 generates a bias current as a current source based on the bias of the bias voltage Vb. A gate of the third NMOS transistor N3 is connected with a high voltage pu, and a source of the third NMOS transistor N3 is grounded. The third NMOS transistor N3 is turned on when its gate voltage is a high voltage, and the third NMOS transistor N3 serves as a dummy transistor.

As shown in FIGS. 2 and 3, when the switching enable signal En transitions, a bias node B in the second switching current source branch 23 generates negative bounce in a direction opposite to the transition direction of the switching enable signal En.

Specifically, in this embodiment, the second switching current source branch 23 includes a fourth NMOS transistor N4, a fifth NMOS transistor N5, and a sixth NMOS transistor N6. A drain of the fourth NMOS transistor N4 is connected with the load 21, a gate of the fourth NMOS transistor N4 is connected with a high voltage pu, and a source of the fourth NMOS transistor N4 is connected with a drain of the fifth NMOS transistor N5. The fourth NMOS transistor N4 is turned on when the gate voltage is a high voltage, and the fourth NMOS transistor N4 serves as a dummy transistor. A gate of the fifth NMOS transistor N5 is connected with the bias voltage Vb, and a source of the fifth NMOS transistor N5 is connected with a drain of the sixth NMOS transistor N6. The fifth NMOS transistor N5 generates a bias current as a current source based on the bias of the bias voltage Vb. A gate of the sixth NMOS transistor N6 is connected with the switching enable signal En, and a source of the sixth NMOS transistor N6 is grounded. The sixth NMOS transistor N6 serves as a switch.

As an example, the gates of the second NMOS transistor N2 and the fifth NMOS transistor N5 are connected with one end of a first capacitor C1 for voltage stabilization, the other end of the first capacitor C1 is grounded. In actual use, the first capacitor C1 may be arranged in a circuit that provides the bias voltage Vb, and the first capacitor C1 may not be provided when the stability of the bias voltage Vb is ensured.

As shown in FIGS. 2 and 3, as an implementation of the present disclosure, the switching current source circuit 2 further includes a seventh NMOS transistor N7. A drain of the seventh NMOS transistor N7 is connected with the load 21, a gate of the seventh NMOS transistor N7 is connected with a preset voltage Vb_cas, and a source of the seventh NMOS transistor N7 is connected with the drains of the first NMOS transistor N1 and the fourth NMOS transistor N4. The seventh NMOS transistor N7 adjusts the impedance of the entire circuit based on the preset voltage Vb_cas to achieve impedance matching. As an example, the gate of the seventh NMOS transistor N7 is connected with one end of the second capacitor C2 for voltage stabilization, the other end of the second capacitor C2 is grounded. In actual use, the second capacitor C2 may be arranged in a circuit that provides the preset voltage Vb_cas, and the second capacitor C2 may not be provided when the stability of the preset voltage Vb_cas is ensured.

As shown in FIGS. 2 and 3, as an implementation of the present disclosure, the switching current source circuit 2 further includes a first current source I1. One end of the first current source I1 is connected with the drains of the first NMOS transistor N1 and the fourth NMOS transistor N4, and the other end of the first current source I1 is grounded. The first current source I1 is used to further speed up the establishment of current. When the second NMOS transistor N2 and the fifth NMOS transistor N5 are disabled, there is still current passing through the first current source I1, to ensure that the circuits above the drains of the first NMOS transistor N1 and the fourth NMOS transistor N4 are not completely closed, which further improves the recovery speed of the current source. Generally, the value of current of the first current source I1 is 5% to 10% of the sum of the current of the first switching current source branch 22 and the second switching current source branch 23. The specific value of the current of the first current source I1 can be set according to actual needs, it is not limited to this embodiment.

Figure 4:
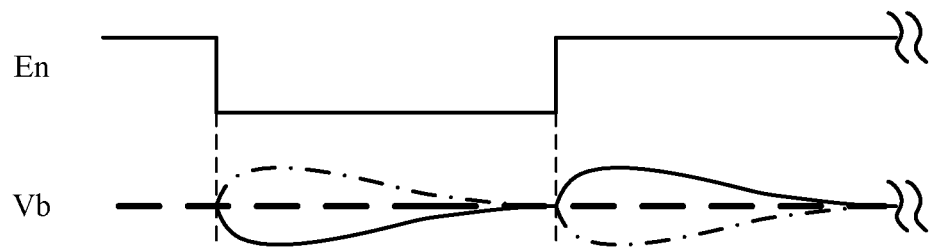
FIG. 4 shows a schematic view that the bias voltage in the switching current source circuit generates bounces canceled with each other with the transition of the switching enable signal according to an embodiment of the present disclosure.

FIG. 4 shows a schematic view that the bias voltage in the switching current source circuit generates bounces canceled with each other with the transition of the switching enable signal according to an embodiment of the present disclosure. As shown in FIGS. 2 to 4, in the first switching current source branch 22, a switch transistor N1 controlled by the enable signal En is set at a drain (bias node A) of a current mirror device N2. When the switching enable signal En transitions from a high level to a low level, the voltage of the bias node A transitions from Vb_cas−Vgs (Vgs is a gate-source voltage of the seventh NMOS transistor N7) to 0, the bias voltage Vb has a voltage bounce downward (solid line in FIG. 4), and the current generated on the second NMOS transistor N2 fluctuates accordingly. In the second switching current source branch 23, a switch transistor N6 controlled by the enable signal En is set at a source (bias node B) of a current mirror device N5. When the switching enable signal En transitions from a high level to a low level, a voltage of the bias node B transitions from 0 to Vb−Vth (Vth is a threshold voltage of the fifth NMOS transistor N5), the bias voltage Vb has a voltage bounce upward (dotted line in FIG. 4), the current generated on the fifth NMOS transistor N5 fluctuates accordingly. The downward bounce and the upward bounce cancel each other out, and the current on the load 21 is quickly established. When the switching enable signal En changes from a low level to a high level, the voltage of the bias node A transitions from 0 to Vb_cas−Vgs, and the bias voltage Vb has a voltage bounce upward (solid line in FIG. 4). The voltage of the bias node B transitions from Vb−Vth to 0, and the bias voltage Vb has a voltage bounce downward (dotted line in FIG. 4). The upward bounce and the downward bounce cancel each other out, and the current on the load 21 is quickly established. Therefore, the current source can be quickly established without a large coupling capacitor, and the circuit area and cost are greatly reduced.

The third NMOS transistor N3 and the fourth NMOS transistor N4 are used as dummy transistors to provide a fixed voltage drop, so that the gate-source voltages of the second NMOS transistor N2 and the fifth NMOS transistor N5 are equal, thus obtaining accurate bias current.

The first current source I1 still has current flowing after the first switching current source branch 22 and the second switching current source branch 23 are disabled, so as to further accelerate the speed of re-establishing current.

Figure 5:
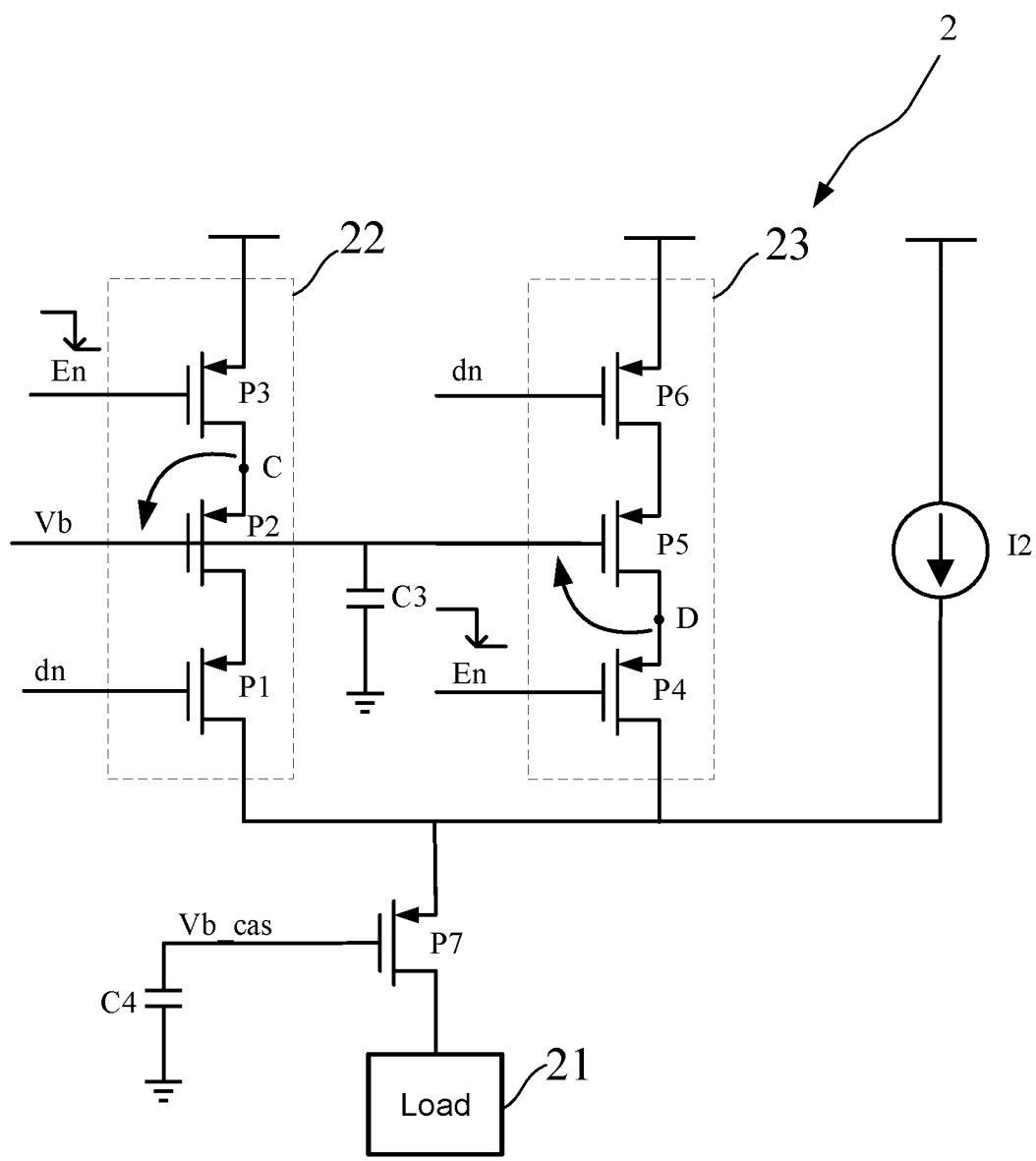
FIGS. 5 and 6 show schematic views of another structure of a switching current source circuit according to an embodiment of the present disclosure, respectively.
Figure 6:
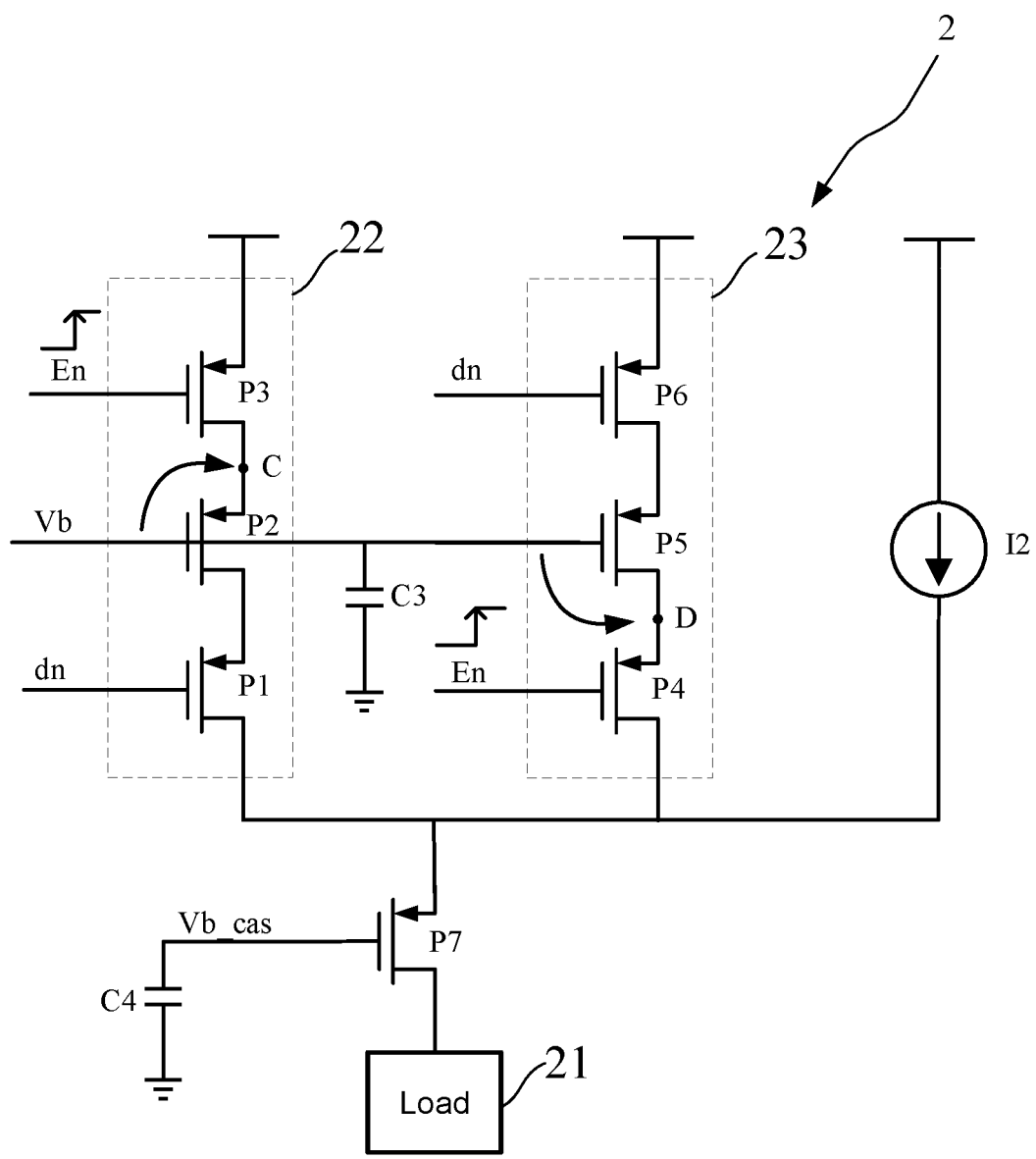

FIGS. 5 and 6 show another schematic view of a switching current source circuit according to an embodiment of the present disclosure. The difference from the circuits of FIGS. 2 and 3 is that the embodiments of FIGS. 5 and 6 are implemented using PMOS devices.

As shown in FIGS. 5 and 6, the first switching current source branch 22 includes a first PMOS transistor P1, a second PMOS transistor P2, and a third PMOS transistor P3. A drain of the first PMOS transistor P1 is connected with the load 21, a gate of the first PMOS transistor P1 is connected with a low voltage dn, and a source of the first PMOS transistor P1 is connected with a drain of the second PMOS transistor P2. The first PMOS transistor P1 is turned on when its gate voltage is a low voltage, and the first PMOS transistor P1 serves as a dummy transistor. A gate of the second PMOS transistor P2 is connected with a bias voltage Vb, and a source of the second PMOS transistor P2 is connected with a drain of the third PMOS transistor P3. The second PMOS transistor P2 generates a bias current as a current source based on the bias of the bias voltage Vb. A gate of the third PMOS transistor P3 is connected with the switching enable signal En, and a source of the third PMOS transistor P3 is connected with a power supply. The third PMOS transistor P3 serves as a switch.

As shown in FIGS. 5 and 6, the second switching current source branch 23 includes a fourth PMOS transistor P4, a fifth PMOS transistor P5, and a sixth PMOS transistor P6. A drain of the fourth PMOS transistor P4 is connected with the load 21, a gate of the fourth PMOS transistor P4 is connected with the switching enable signal En, and a source of the fourth PMOS transistor P4 is connected with a drain of the fifth PMOS transistor P5. The fourth PMOS transistor P4 serves as a switch. A gate of the fifth PMOS transistor P5 is connected with the bias voltage Vb, and a source of the fifth PMOS transistor P5 is connected with a drain of the sixth PMOS transistor P6. The fifth PMOS transistor P5 generates a bias current as a current source based on the bias of the bias voltage Vb. A gate of the sixth PMOS transistor P6 is connected with a low voltage dn, and a source of the sixth PMOS transistor P6 is connected with the power supply. The sixth PMOS transistor P6 is turned on when its gate voltage is a low voltage, and the sixth PMOS transistor P6 serves as a dummy transistor.

As an example, the gates of the second PMOS transistor P2 and the fifth PMOS transistor P5 are connected with one end of a third capacitor C3 for voltage stabilization, the other end of the third capacitor C3 is grounded. In actual use, the third capacitor C3 may be arranged in a circuit that provides the bias voltage Vb, and the third capacitor C3 may not be provided when the stability of the bias voltage Vb is ensured.

As shown in FIGS. 5 and 6, as an implementation of the present disclosure, the switching current source circuit 2 further includes a seventh PMOS transistor P7. A drain of the seventh PMOS transistor P7 is connected with the load 21, a gate of the seventh PMOS transistor P7 is connected with a preset voltage Vb_cas, and a source of the seventh PMOS transistor P7 is connected with the drains of the first PMOS transistor P1 and the fourth PMOS transistor P4. As an example, the gate of the seventh PMOS transistor P7 is connected with one end of a fourth capacitor C4 for voltage stabilization, the other end of the fourth capacitor C4 is grounded. In actual use, the fourth capacitor C4 may be arranged in a circuit that provides the preset voltage Vb_cas, and the fourth capacitor C4 may not be provided when the stability of the preset voltage Vb_cas is ensured.

As shown in FIGS. 5 and 6, as an implementation of the present disclosure, the switching current source circuit 2 further includes a second current source I2. One end of the second current source I2 is connected with the drains of the first PMOS transistor P1 and the fourth PMOS transistor P4, and the other end of the second current source I2 is grounded. The function of the second current source I2 is the same as the function of the first current source I1, which will not be repeated here.

As shown in FIGS. 5 and 6, in the first switching current source branch 22, a switch transistor P3 controlled by the enable signal En is set at a source (bias node C) of a current mirror device P2. When the switching enable signal En transitions from a high level to a low level, the bias voltage Vb has a voltage bounce downward, and the current generated on the second PMOS transistor P2 fluctuates accordingly. In the second switching current source branch 23, a switch transistor P4 controlled by the enable signal En is set at a drain (bias node D) of a current mirror device P5. When the switching enable signal En transitions from a high level to a low level, the bias voltage Vb has a voltage bounce upward, and the current generated on the fifth PMOS transistor P5 fluctuates accordingly. The downward bounce and the upward bounce cancel each other out. When the switching enable signal En changes from a low level to a high level, the bias voltage Vb in the first switching current source branch 22 has a voltage bounce upward. The bias voltage Vb in the second switching current source branch 23 has a voltage bounce downward. The upward bounce and the downward bounce cancel each other out, and the current on the load 21 is quickly established.

Figure 7:
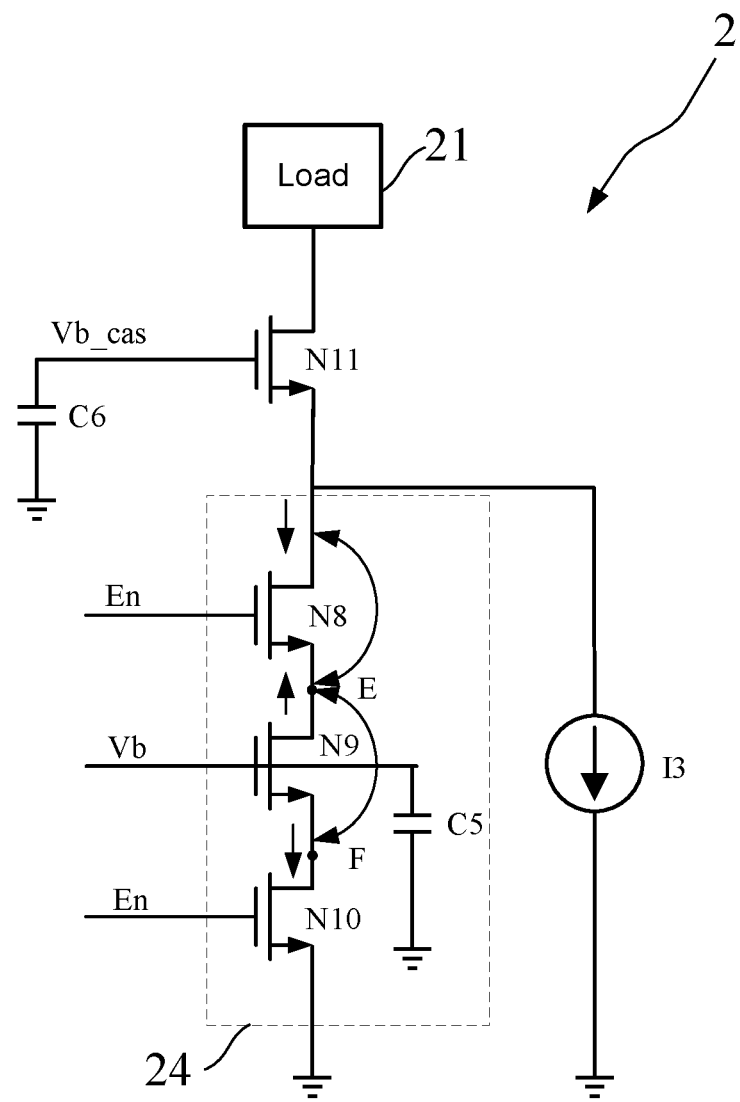
FIGS. 7 and 8 show schematic views of a switching current source circuit according to another embodiment of the present disclosure, respectively.

FIG. 7 shows a schematic view of a switching current source circuit according to another embodiment of the present disclosure. The difference from the previous embodiment is that this embodiment includes only one switching current source branch. The switching current source circuit 2 includes: a switching current source branch 24 connected with one end of the load 21, to regulate the current flowing through the load 21.

As shown in FIG. 7, when the switching enable signal En transitions, a first bias node E in the switching current source branch 24 generates positive bounce in the same direction as the transition direction of the switching enable signal En. When the switching enable signal En transitions, a second bias node F in the switching current source branch 24 generates negative bounce in a direction opposite to the transition direction of the switching enable signal En. The positive bounce and the negative bounce cancel each other out.

Specifically, in this embodiment, the switching current source branch 24 includes an eighth NMOS transistor N8, a ninth NMOS transistor N9, and a tenth NMOS transistor N10. A drain of the eighth NMOS transistor N8 is connected with the load 21, a gate of the eighth NMOS transistor N8 is connected with the switching enable signal En, and a source of the eighth NMOS transistor N8 is connected with a drain of the ninth NMOS transistor N9. The eighth NMOS transistor N8 serves as a switch. A gate of the ninth NMOS transistor N9 is connected with a bias voltage Vb, and a source of the ninth NMOS transistor N9 is connected with a drain of the tenth NMOS transistor N10. The ninth NMOS transistor N9 generates a bias current as a current source based on the bias of the bias voltage Vb. A gate of the tenth NMOS transistor N10 is connected with the switching enable signal En, and a source of the tenth NMOS transistor N10 is grounded. The tenth NMOS transistor N10 serves as a switch.

As an example, the gate of the ninth NMOS transistor N9 is connected with one end of a fifth capacitor C5 for voltage stabilization, the other end of the fifth capacitor C5 is grounded. In actual use, the fifth capacitor C5 may be arranged in a circuit that provides the bias voltage Vb, and the fifth capacitor C5 may not be provided when the stability of the bias voltage Vb is ensured.

As shown in FIG. 7, as an implementation of the present disclosure, the switching current source circuit 2 further includes an eleventh NMOS transistor N11. A drain of the eleventh NMOS transistor N11 is connected with the load 21, a gate of the eleventh NMOS transistor N11 is connected with a preset voltage Vb_cas, and a source of the eleventh NMOS transistor N11 is connected with the drain of the eighth NMOS transistor N8. As an example, the gate of the eleventh NMOS transistor N11 is connected with one end of a sixth capacitor C6 for voltage stabilization, the other end of the sixth capacitor C6 is grounded. In actual use, the sixth capacitor C6 may be arranged in a circuit that provides the preset voltage Vb_cas, and the sixth capacitor C6 may not be provided when the stability of the preset voltage Vb_cas is ensured.

As shown in FIG. 7, as an implementation of the present disclosure, the switching current source circuit 2 further includes a third current source I3. One end of the third current source I3 is connected with the drain of the eighth NMOS transistor N8, and the other end of the third current source I3 is grounded. The function of the third current source I3 is the same as the function of the first current source I1, which will not be repeated here.

As shown in FIG. 7, in the switching current source branch 24, a switch transistor N8 is set at a drain of a current mirror device N9, and a switch transistor N10 is set at a source of the current mirror device N9. When the switching enable signal En transitions, the bias voltage Vb is affected and has a voltage bounce upward and downward. The upward bounce and downward bounce cancel each other out. The charges across the ninth NMOS transistor N9 are shared, and the current on the load 21 is quickly established.

Figure 8:
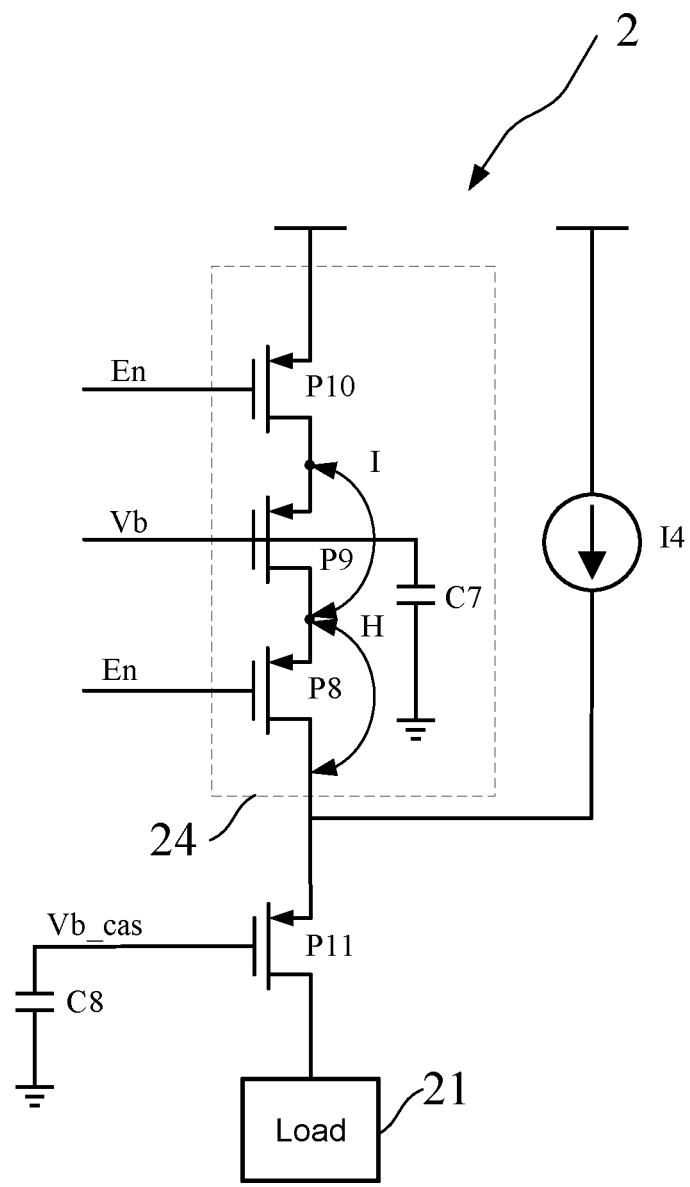

FIG. 8 shows a schematic view of a switching current source circuit according to another embodiment of the present disclosure. The difference from the circuit of FIG. 7 is that this embodiment is implemented using PMOS devices.

As shown in FIG. 8, the switching current source branch 24 includes an eighth PMOS transistor P8, a ninth PMOS transistor P9, and a tenth PMOS transistor P10. A drain of the eighth PMOS transistor P8 is connected with the load 21, a gate of the eighth PMOS transistor P8 is connected with the switching enable signal En, and a source of the eighth PMOS transistor P8 is connected with a drain of the ninth PMOS transistor P9. The eighth PMOS transistor P8 serves as a switch. A gate of the ninth PMOS transistor P9 is connected with the bias voltage Vb, and a source of the ninth PMOS transistor P9 is connected with a drain of the tenth PMOS transistor P10. The ninth PMOS transistor P9 generates a bias current as a current source based on the bias of the bias voltage Vb. A gate of the tenth PMOS transistor P10 is connected with the switching enable signal En, and a source of the tenth PMOS transistor P10 is grounded. The tenth PMOS transistor P10 serves as a switch.

As an example, the gate of the ninth PMOS transistor P9 is connected with one end of a seventh capacitor C7 for voltage stabilization, the other end of the seventh capacitor C7 is grounded. In actual use, the seventh capacitor C7 may be arranged in a circuit that provides the bias voltage Vb, and the seventh capacitor C7 may not be provided when the stability of the bias voltage Vb is ensured.

As shown in FIG. 8, as an implementation of the present disclosure, the switching current source circuit 2 further includes an eleventh PMOS transistor P11. A drain of the eleventh PMOS transistor P11 is connected with the load 21, a gate of the eleventh PMOS transistor P11 is connected with a preset voltage Vb_cas, and a source of the eleventh PMOS transistor P11 is connected with the drain of the eighth PMOS transistor P8. As an example, the gate of the eleventh PMOS transistor P11 is connected with one end of an eighth capacitor C8 for voltage stabilization, the other end of the eighth capacitor C8 is grounded. In actual use, the eighth capacitor C8 may be arranged in a circuit that provides the preset voltage Vb_cas, and the eighth capacitor C8 may not be provided when the stability of the preset voltage Vb_cas is ensured.

As shown in FIG. 8, as an implementation of the present disclosure, the switching current source circuit 2 further includes a fourth current source I4. One end of the fourth current source I4 is connected with the drain of the eighth PMOS transistor P8, and the other end of the third current source I4 is grounded. The function of the fourth current source I4 is the same as the function of the first current source I1, which will not be repeated here.

It should be noted that, the switching current source circuit of this embodiment generates bounce in the direction opposite to that of FIG. 7 at bias nodes H and I, respectively. The bounce at node H and the bounce at node I are cancelled. The principle is similar and will not be repeated here.

This embodiment provides a method for quickly establishing a switching current source, which may be implemented based on any of the above-mentioned circuits. Any circuit that can implement the method of the present disclosure is applicable to, and is not limited to, this embodiment. The method for quickly establishing the switching current source includes: generating, by the two bias nodes respectively, positive bounce in the same direction as the transition direction of the switching enable signal and negative bounce in a direction opposite to the transition direction of the switching enable signal when the switching enable signal En transitions; cancelling the positive bounce with the negative bounce, so that the current flowing through the load is quickly established when a toggle event happens.

For example, taking the switching current source circuit shown in FIGS. 2 and 3 as an example, two bias nodes (A and B) are respectively provided in two parallel switching current source branches 22 and 23. A balanced charge coupling can be obtained by adjusting the current ratio between the two switching current source branches, by making Cgd_b1*(Vb_cas−Vgs_cas)=Cgs_b2*(Vb−Vth), or making Cgd_b1*vdsat_mir=Cgs_b2*(Vb−Vth). Cgd_b1 is the capacitance between the gate and drain of the second NMOS transistor N2, Vgs_cas is the gate-source voltage of the seventh NMOS transistor N7, Cgs_b2 is the capacitance between the gate and drain of the fifth NMOS transistor N5, and vdsat_mir is the minimum value of Vb_cas−Vgs_cas. The circuit principles of FIGS. 5 and 6 are similar to those of FIGS. 2 and 3. The two bias nodes in FIGS. 7 and 8 are set in the same switching current source branch, which can reduce the wiring complexity when drawing the layout. The key to the design is to adjust the size of the switch transistor controlled by the enable signal En, so that the charge changes of the two bias nodes cancel each other when the enable signal En is switched. Taking FIG. 7 as an example, the changed charges of the bias nodes E and F are coupled to the gate of the ninth NMOS transistor N9 through the gate-drain capacitance Cgd and the gate-source capacitance Cgs of the ninth NMOS transistor N9. The coupling charge movement directions of the two bias nodes E and F are opposite. By adjusting the sizes of the eighth NMOS transistor N8 and the tenth NMOS transistor N10, the charges of the two bias nodes E and F coupled to the gate of the ninth NMOS transistor N9 are cancelled, thereby quickly establishing of the switching current source. The principles of FIGS. 7 and 8 are similar to the circuit principles of FIGS. 2 and 3 and that of FIGS. 5 and 6, which are not repeated here.

In summary, the present disclosure provides a switching current source circuit and a method for quickly establishing a switching current source. The switching current source circuit includes a first switching current source branch and a second switching current source branch connected in parallel with one end of the load, for regulating the current flowing through the load. When the switching enable signal transitions, the bias node in the first switching current source branch generates positive bounce in the same direction as the transition direction of the switching enable signal, and the bias node in the second switching current source branch generates negative bounce in a direction opposite to the transition direction of the switching enable signal. The positive bounce and the negative bounce cancel each other out, so that the current flowing through the load is quickly established when a toggle event happens.

Alternately, the switching current source circuit only includes a switching current source branch connected with an end of the load, to regulate the current flowing through the load. When the switching enable signal transitions, the first bias node in the switching current source branch generates positive bounce in the same direction as the transition direction of the switching enable signal, and the second bias node in the switching current source branch generates negative bounce in a direction opposite to the transition direction of the switching enable signal. The positive bounce and the negative bounce cancel each other out, so that the current flowing through the load is quickly established when a toggle event happens. The switching current source circuit and the method for quickly establishing the switching current source of the present disclosure accelerate the establishment of current through the coupling of charges, and reduce the decoupling capacitance at the same time, thereby reducing the circuit area and saving the costs. Therefore, the present disclosure effectively overcomes various shortcomings in the existing technology and has high industrial utilization value.

The above-mentioned embodiments are just used for exemplarily describing the principle and effects of the present disclosure instead of limiting the present disclosure. Those skilled in the art can make modifications or changes to the above-mentioned embodiments without going against the spirit and the range of the present disclosure. Therefore, all equivalent modifications or changes made by those who have common knowledge in the art without departing from the spirit and technical concept disclosed by the present disclosure shall be still covered by the claims of the present disclosure.

We claim:
1. A switching current source circuit, at least comprising:
a first switching current source branch and a second switching current source branch connected in parallel with an end of a load and configured to regulate a current flowing through the load;
when a switching enable signal transitions, a bias node in the first switching current source branch generates positive bounce in the same direction as a transition direction of the switching enable signal, a bias node in the second switching current source branch generates negative bounce in a direction opposite to the transition direction of the switching enable signal, the positive bounce and the negative bounce cancel each other out, so that the current flowing through the load is quickly established when a toggle event happens,
wherein the first switching current source branch comprises a first NMOS transistor, a second NMOS transistor, and a third NMOS transistor, wherein
a drain of the first NMOS transistor is connected with the load, a gate of the first NMOS transistor is connected with the switching enable signal, and a source of the first NMOS transistor is connected with a drain of the second NMOS transistor,
a gate of the second NMOS transistor is connected with a bias voltage, and a source of the second NMOS transistor is connected with a drain of the third NMOS transistor, and
a gate of the third NMOS transistor is connected with a high voltage, and a source of the third NMOS transistor is grounded; and
the second switching current source branch comprises a fourth NMOS transistor, a fifth NMOS transistor, and a sixth NMOS transistor, wherein
a drain of the fourth NMOS transistor is connected with the load, a gate of the fourth NMOS transistor is connected with the high voltage, and a source of the fourth NMOS transistor is connected with a drain of the fifth NMOS transistor,
a gate of the fifth NMOS transistor is connected with the bias voltage, and a source of the fifth NMOS transistor is connected with a drain of the sixth NMOS transistor, and
a gate of the sixth NMOS transistor is connected with the switching enable signal, and a source of the sixth NMOS transistor is grounded.

2. The switching current source circuit according to claim 1, further comprising a seventh NMOS transistor; a drain of the seventh NMOS transistor is connected with the load, a gate of the seventh NMOS transistor is connected with a preset voltage, and a source of the seventh NMOS transistor is connected with the drains of the first NMOS transistor and the fourth NMOS transistor.

3. The switching current source circuit according to claim 2, further comprising a first current source; one end of the first current source is connected with the drains of the first NMOS transistor and the fourth NMOS transistor, and the other end of the first current source is grounded.

4. The switching current source circuit according to claim 1, further comprising a first current source; one end of the first current source is connected with the drains of the first NMOS transistor and the fourth NMOS transistor, and the other end of the first current source is grounded.

5. A switching current source circuit, at least comprising:
a switching current source branch connected with an end of a load and configured to regulate a current flowing through the load;
when a switching enable signal transitions, a first bias node in the switching current source branch generates positive bounce in the same direction as a transition direction of the switching enable signal, a second bias node in the switching current source branch generates negative bounce in a direction opposite to the transition direction of the switching enable signal, the positive bounce and the negative bounce cancel each other out, so that the current flowing through the load is quickly established when a toggle event happens,
wherein the switching current source circuit further comprises an eighth NMOS transistor, a ninth NMOS transistor, a tenth NMOS transistor, and an eleventh NMOS transistor, wherein
a drain of the eighth NMOS transistor is connected with the load, a gate of the eighth NMOS transistor is connected with the switching enable signal, and a source of the eighth NMOS transistor is connected with a drain of the ninth NMOS transistor;
a gate of the ninth NMOS transistor is connected with a bias voltage, and a source of the ninth NMOS transistor is connected with a drain of the tenth NMOS transistor;
a gate of the tenth NMOS transistor is connected with the switching enable signal, and a source of the tenth NMOS transistor is grounded; and
a drain of the eleventh NMOS transistor is connected with the load, a gate of the eleventh NMOS transistor is connected with a preset voltage, and a source of the eleventh NMOS transistor is connected with the drain of the eighth NMOS transistor.

6. The switching current source circuit according to claim 5, further comprising a third current source; one end of the third current source is connected with the drain of the eighth NMOS transistor, and the other end of the third current source is grounded.

7. A switching current source circuit, at least comprising:
a first switching current source branch and a second switching current source branch connected in parallel with an end of a load and configured to regulate a current flowing through the load;
when a switching enable signal transitions, a bias node in the first switching current source branch generates positive bounce in the same direction as a transition direction of the switching enable signal, a bias node in the second switching current source branch generates negative bounce in a direction opposite to the transition direction of the switching enable signal, the positive bounce and the negative bounce cancel each other out, so that the current flowing through the load is quickly established when a toggle event happens,
wherein the first switching current source branch includes a first PMOS transistor, a second PMOS transistor and a third PMOS transistor, wherein
a drain of the first PMOS transistor is connected with the load, a gate of the first PMOS transistor is connected with a low voltage, and a source of the first PMOS transistor is connected with a drain of the second PMOS transistor,
a gate of the second PMOS transistor is connected with a bias voltage, and a source of the second PMOS transistor is connected with a drain of the third PMOS transistor, and
a gate of the third PMOS transistor is connected with the switching enable signal, and a source of the third PMOS transistor is connected with a power supply; and the second switching current source branch includes a fourth PMOS transistor, a fifth PMOS transistor and a sixth PMOS transistor, wherein a drain of the fourth PMOS transistor is connected with the load, a gate of the fourth PMOS transistor is connected with the switching enable signal, and a source of the fourth PMOS transistor is connected with a drain of the fifth PMOS transistor, a gate of the fifth PMOS transistor is connected with the bias voltage, and a source of the fifth PMOS transistor is connected with a drain of the sixth PMOS transistor, and a gate of the sixth PMOS transistor is connected with the low voltage, and a source of the sixth PMOS transistor is connected with the power supply.

8. The switching current source circuit according to claim 7, further comprising a seventh PMOS transistor; a drain of the seventh PMOS transistor is connected with the load, a gate of the seventh PMOS transistor is connected with a preset voltage, and a source of the seventh PMOS transistor is connected with the drains of the first PMOS transistor and the fourth PMOS transistor.

9. The switching current source circuit according to claim 8, further comprising a second current source; one end of the second current source is connected with the drains of the first PMOS transistor and the fourth PMOS transistor, and the other end of the second current source is connected with the power supply.

10. The switching current source circuit according to claim 7, further comprising a second current source; one end of the second current source is connected with the drains of the first PMOS transistor and the fourth PMOS transistor, and the other end of the second current source is connected with the power supply.

* * * * *